United States Patent
Abramovitch et al.

(10) Patent No.: US 6,646,964 B1
(45) Date of Patent: Nov. 11, 2003

(54) HARMONIC CORRECTION IN PHASE-LOCKED LOOPS

(75) Inventors: Daniel Y. Abramovitch, Palo Alto, CA (US); Michael C. Fischer, Palo Alto, CA (US); Joshua N. Hogan, Los Altos, CA (US); Carl P. Taussig, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/536,298

(22) Filed: Mar. 27, 2000

(51) Int. Cl.[7] .................................................. G11B 7/00
(52) U.S. Cl. .............................. 369/47.25; 369/124.11
(58) Field of Search ..................... 369/47.25, 47.26, 369/47.28, 53.35, 59.2, 59.15, 59.16, 124.1, 124.11, 124.13, 53.18, 53.19, 23.53, 47.44, 47.38, 47.39, 47.41, 47.43

(56) References Cited

U.S. PATENT DOCUMENTS

| | | | | |
|---|---|---|---|---|
| 4,096,360 A | * | 6/1978 | Takahashi et al. | 369/47.16 |
| 4,617,679 A | * | 10/1986 | Brooks | 375/374 |
| 4,769,691 A | * | 9/1988 | Dischert | 348/505 |
| 5,231,507 A | * | 7/1993 | Sakata et al. | 386/19 |
| 6,046,968 A | * | 4/2000 | Abramovitch et al. | 369/47.28 |

* cited by examiner

Primary Examiner—Thang V. Tran
Assistant Examiner—Bach Vuong

(57) ABSTRACT

Correction for harmonic disturbances on rotating storage media in a phase-locked loop. The effects of harmonic disturbances in a phase-locked loop are reduced by employing harmonic correction. Harmonic correction may be present in the loop at all times, or may be switched in once the loop has achieved phase lock. Disturbance within the loop bandwidth is corrected using additional integrating pole or a bump (resonant) filter. Disturbance outside the loop bandwidth is corrected using low pass or a notch (anti-resonant) filter. Alternately, a canceling signal may be generated and added as a feedforward signal. A repetitive control scheme uses a filtered version of the residual errors on previous media rotations as a feedforward signal to cancel harmonic effects.

4 Claims, 7 Drawing Sheets

HARMONIC CORRECTION IN PHASE-LOCKED LOOPS

BACKGROUND OF THE INVENTION

1. Field of the Invention

The present invention relates to the field of data storage and synchronization. In particular it relates to a method for compensating for a class or repeatable disturbances that are very common in the area of rotating machinery, and specifically in the area of rotating storage media on a spindle. In such cases, spindle rotation causes many disturbances to be injected into the loop used to recover signals used for synchronization. A large fraction of these disturbances are harmonic, that is, they occur at a known frequency which is related to the spindle frequency.

2. Art Background

Disk data storage devices feature rotating media with data recorded on tracks on the media. These tracks may be in the form of a plurality of concentric circles, or they may be in the form of a single spiral. Formatting information is present on the media which allows the disk drive to recover the signals needed to read and possibly write information to and from the media. The media is rotated on a spindle. Imperfections in the spindle apparatus, and in the positioning of the media, introduce disturbances into signals read from the media. Many of these disturbances are harmonic in nature, occurring at a known frequency which is related to the spindle frequency.

For fixed magnetic disk drives, in which the tracks are formatted after the media has been secured to the spindle, the dominant harmonics are most closely related to minor defects and tolerances in the spindle itself. However, in removable media, such as an optical storage medium, including but not limited to DVD+RW, the dominant feature is the imprecise positioning of the media and therefore the tracks relative to the true center of the spindle. This positioning offset causes eccentricity in the path which the tracks will take. This means the tracks will not pursue a true circle around the axis of rotation of the spindle; instead, the tracks will have an eccentricity which manifests itself as a set of sinusoidal deviations from the true circular path.

In a storage device using a rotating storage medium, the act of reading or writing data necessitates the generation of a clock signal to keep the data synchronized. Furthermore, this clock must be synchronized to the rotating medium itself, so that the data can be repeatably positioned on, and recovered from, the storage medium. In order to generate a clock for reading or writing, it is common to use a phase-locked loop (PLL) which generates a repeatable clock which uses as its input a reference signal measured from the rotating medium. Phase-locked loops have the general nature that they are feedback loops applied to electronic signals rather than motion control signals.

A multiplicity of loops are commonly used in rotating storage devices. One loop maintains the tracking position of the read/write assembly. Another loop produces the reference clock used for reading and writing data. A third possible loop is used in far field devices, such as rewriteable optical storage, to maintain the height of the readback mechanism or the focus position of the objective lens. Both of the former loops exhibit sensitivity to track eccentricity. The sensitivity of the tracking position loop to the harmonic disturbances described above can be reduced using a variety of methods known to the art. However, even if the distorted track were being followed perfectly, the mere act of following the eccentricity would produce differences in the reference clock period around the circumference of the track.

What is needed is a method for correcting clock recovery loops in the presence of harmonic disturbances.

SUMMARY OF THE INVENTION

Disturbances introduced into a phase-locked loop (PLL) by harmonic sources in rotating storage media are reduced by applying harmonic correction. Harmonic correction may be present at all times in the PLL, or may be switched in once loop lock has been obtained. Harmonic correction reduces the resultant noise and jitter of the loop. The nature of the harmonic correction employed depends on the nature of the disturbance, as well as the nature of the loop. In a first embodiment, where the disturbance is well within the PLL bandwidth, an additional integrating pole or a bump (or resonant) filter is added to the loop. In a second embodiment, where the disturbance is well outside the PLL bandwidth, an additional low pass or notch (anti-resonant) filter is added to the loop. In a third embodiment, harmonic correction is obtained by generating a sinusoid or a combination of sinusoids at a phase and frequency so as to cancel out the disturbance; this signal is added as a feedforward signal. In a forth embodiment, harmonic correction is obtained in a repetitive control scheme using a filtered version of the residual errors on previous rotations of the media as a feedforward signal to cancel harmonic effects. These embodiments may be repeated for each harmonic frequency at which a significant disturbance is present, and may be used in combination with each other.

BRIEF DESCRIPTION OF THE DRAWINGS

The present invention is described with respect to particular exemplary embodiments thereof and reference is made to the drawings in which.

DETAILED DESCRIPTION

Figure 1:
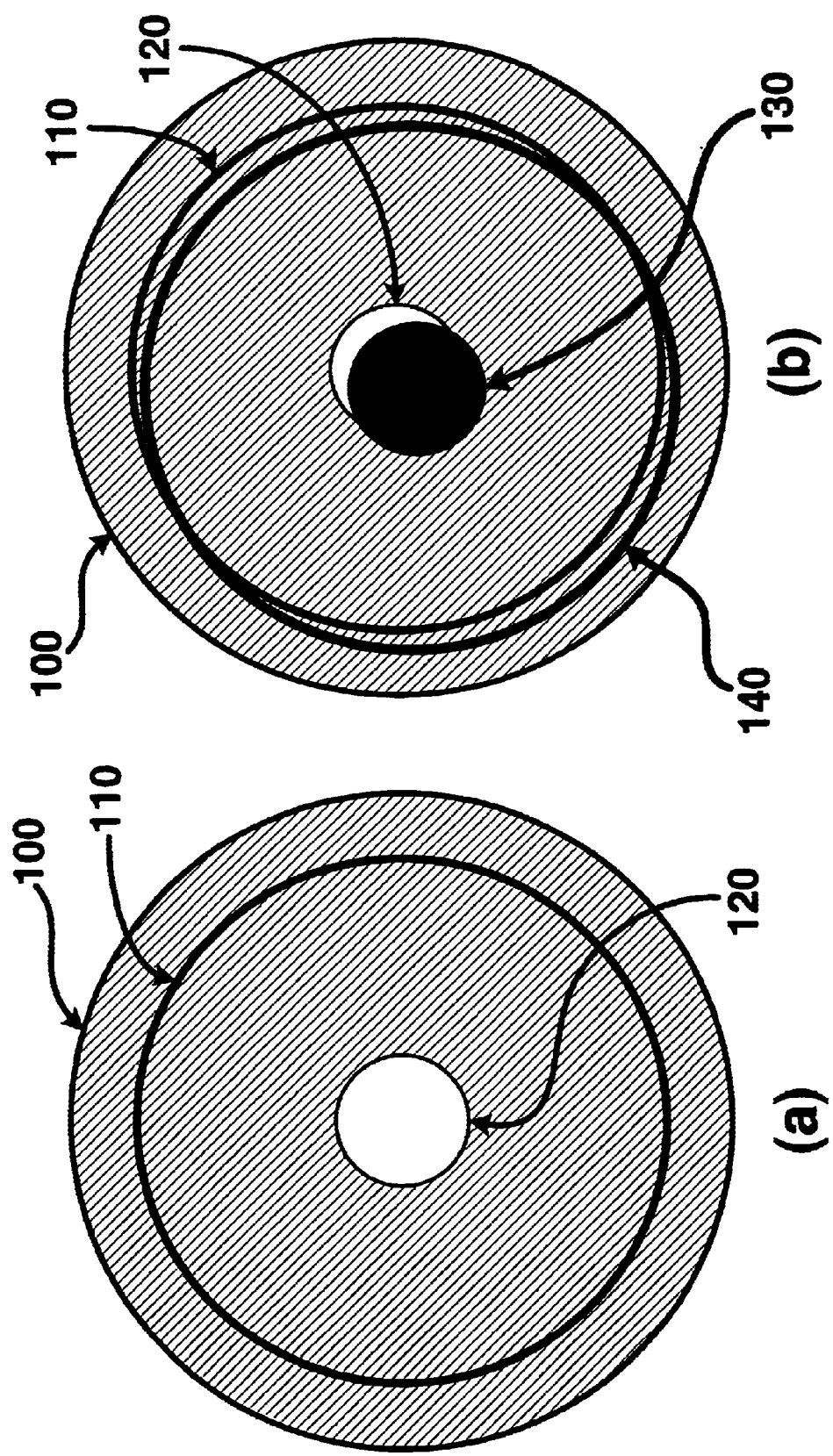
FIG. 1 shows the effects of track eccentricity in a disk drive.

In removable media storage devices, imprecise positioning of the disk on the rotating spindle introduces errors. As shown in FIG. 1(a), disk media 100 has a circular track 110 and disk center 120. The center of disk 100, of track 110, and disk center 120, are all coincident. Unfortunately, when the media is clamped in place on the spindle of a disk drive, the center of the spindle may not be coincident with the center of the disk; the two centers may be offset. Each time the media is removed and replaced, this misalignment may change. The effect of this misalignment is shown in exaggerated form in FIG. 1(b). Here, media 100 with its preformatted track 110 and disk center 120 is shown positioned off the center of spindle 130. The apparent track is shown as 140. This misalignment produces a sinusoidal variation in the track motion as the media rotates. To this is added errors in spindle rotation, which introduces higher order distortion terms. It has been found that the first harmonic is due mostly to misalignment of the disk center with the spindle center and is dominant. However, other harmonics may be of interest, and may be compensated for in similar fashion in accordance with the present invention.

Figure 2:
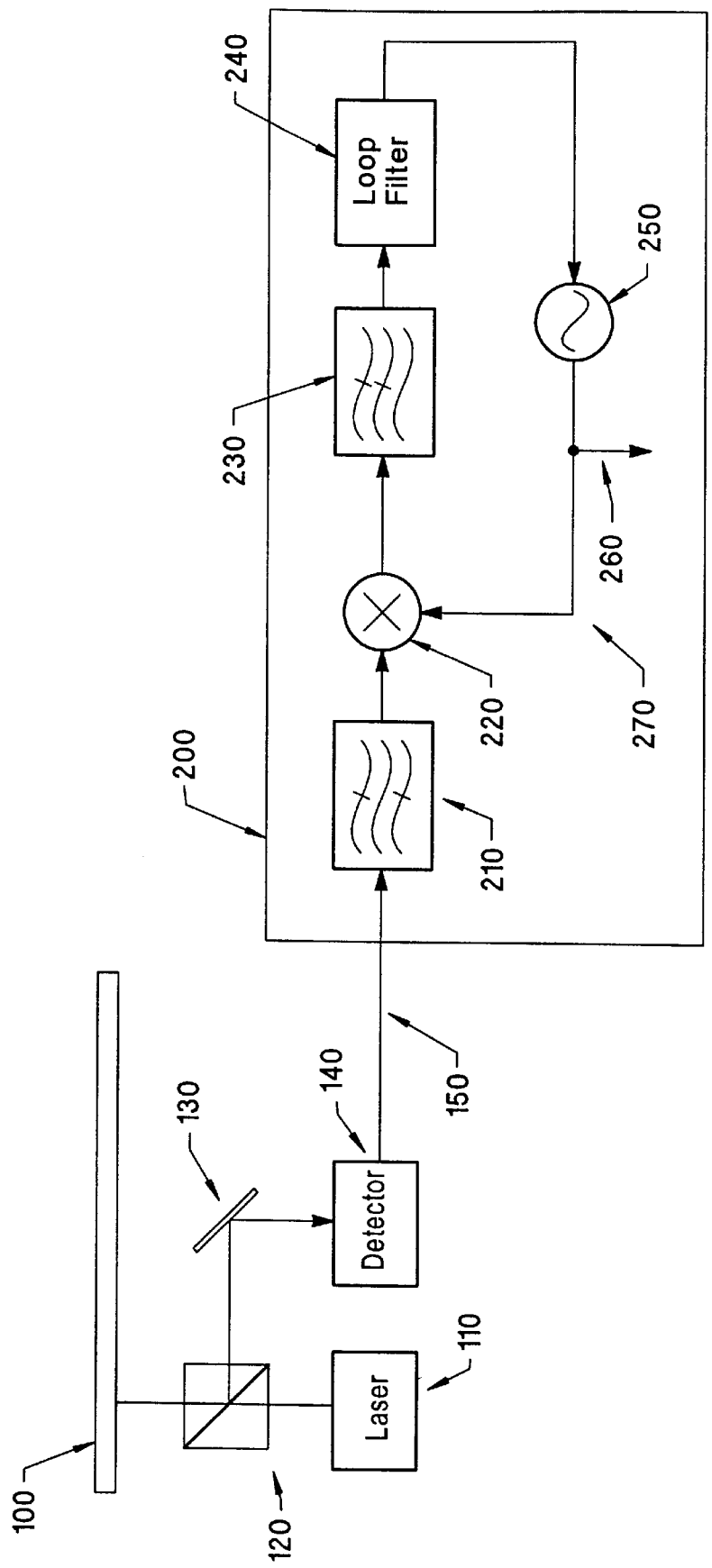
FIG. 2 shows an optical disk drive system with a phase-locked loop.

FIG. 2 shows an optical disk drive system using a phase-locked loop to recover a clock signal. Optical disk 100 is illuminated by laser assembly 110, which produces and focuses a spot of light on the disk. The beam from laser 110 passes through beam splitter 120, which directs light reflected from disk 100 to mirror 130 and detector assembly 140. One of the outputs of detector 140 is a signal 150 used to recover a reference signal. Signal 150 is passed to phase-locked loop 200 to regenerate the reference signal.

Signal 150 is first passed through band pass filter 210, reducing or eliminating frequencies outside of the band of interest. In a mixing loop, the output of bandpass filter 210 is passed to mixer 220. The output of mixer 220 is passed through lowpass filter 230 and loop filter 240, and is used to control voltage controlled oscillator (VCO) 250. One output of VCO 250 is a clock signal 260 which is phase-locked to the reference signal recovered from disk 100. This signal 270 is also sent to mixer 220. The mixer accomplishes the task of phase detection. However, phase detection can also be accomplished in a variety of ways as known to the art, such as those described in Wolaver's *Phase Locked Loop Circuit Design* Advanced Reference Series & Biophysics and Bioengineering Series, published by Prentice Hall, pp 47–79. In many of these approaches, the sinusoidal characteristic of the clock signal is replaced with a rectangular or square wave signal.

Figure 3:
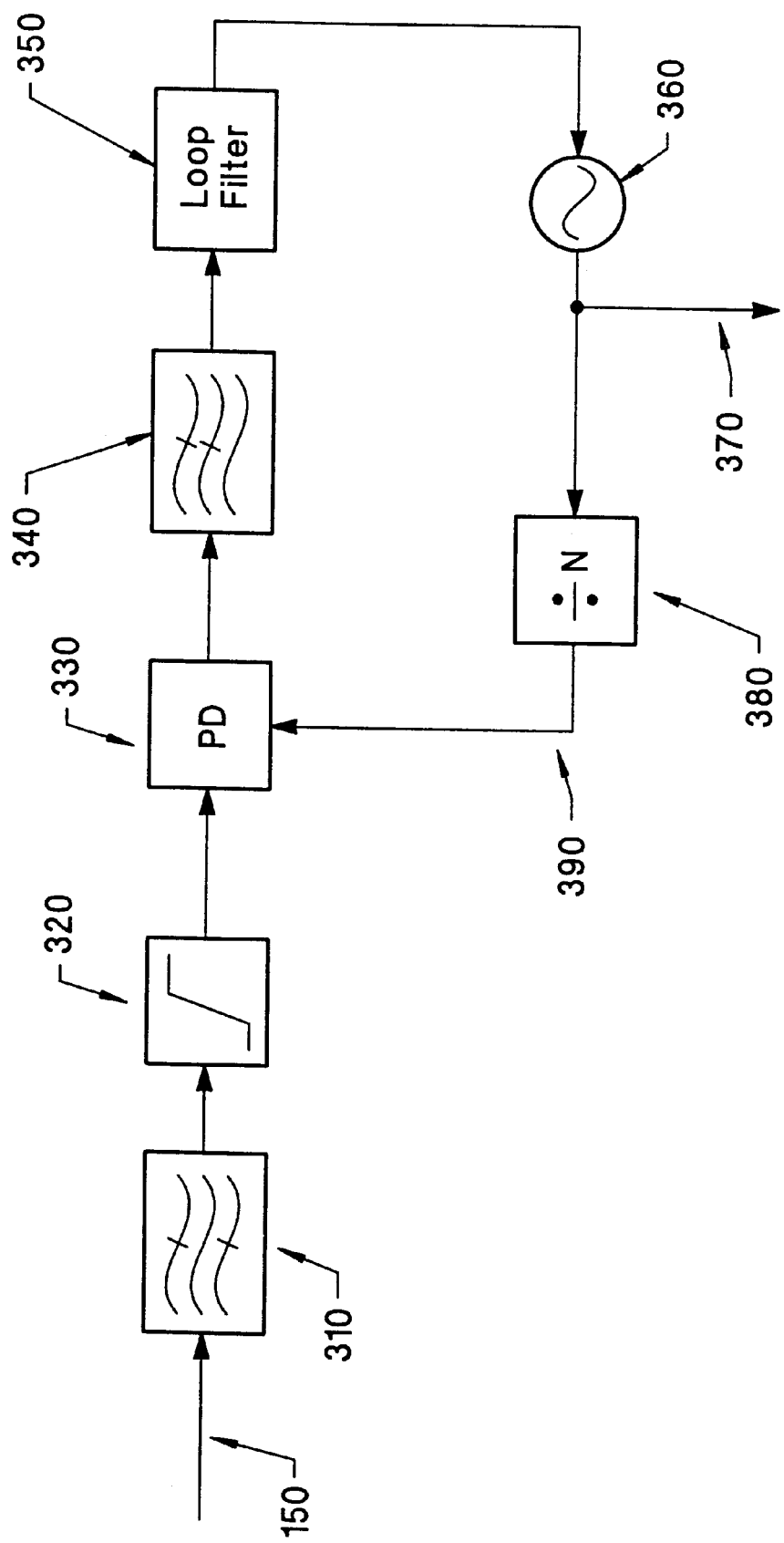
FIG. 3 shows a harmonic locking phase-locked loop using a phase detector.

Other phase-locked loop topologies are also used for such signal recovery. FIG. 3 shows a harmonic locking loop using a phase detector. This topology is useful in that it is capable of producing a reference signal 370 which is a multiple of input signal 150.

Input signal 150 first passes through bandpass filter 310, and is squared up by limiter 320. The output of limiter 320 is one of the inputs to phase detector 330. The output of phase detector 330 is fed to lowpass filter 340 and loop filter 350, which controls voltage controlled oscillator 360. Signal 370 is the reference signal output. The output of VCO 360 is also passed through divider 380, and this divided down signal 390 forms the other input to phase detector 330. Thus output signal 370 is phase-locked to input signal 150, and is a multiple of that input signal, as determined by divider 380. Note that divider 380 may provide a non-integer factor in some applications.

Figure 4:
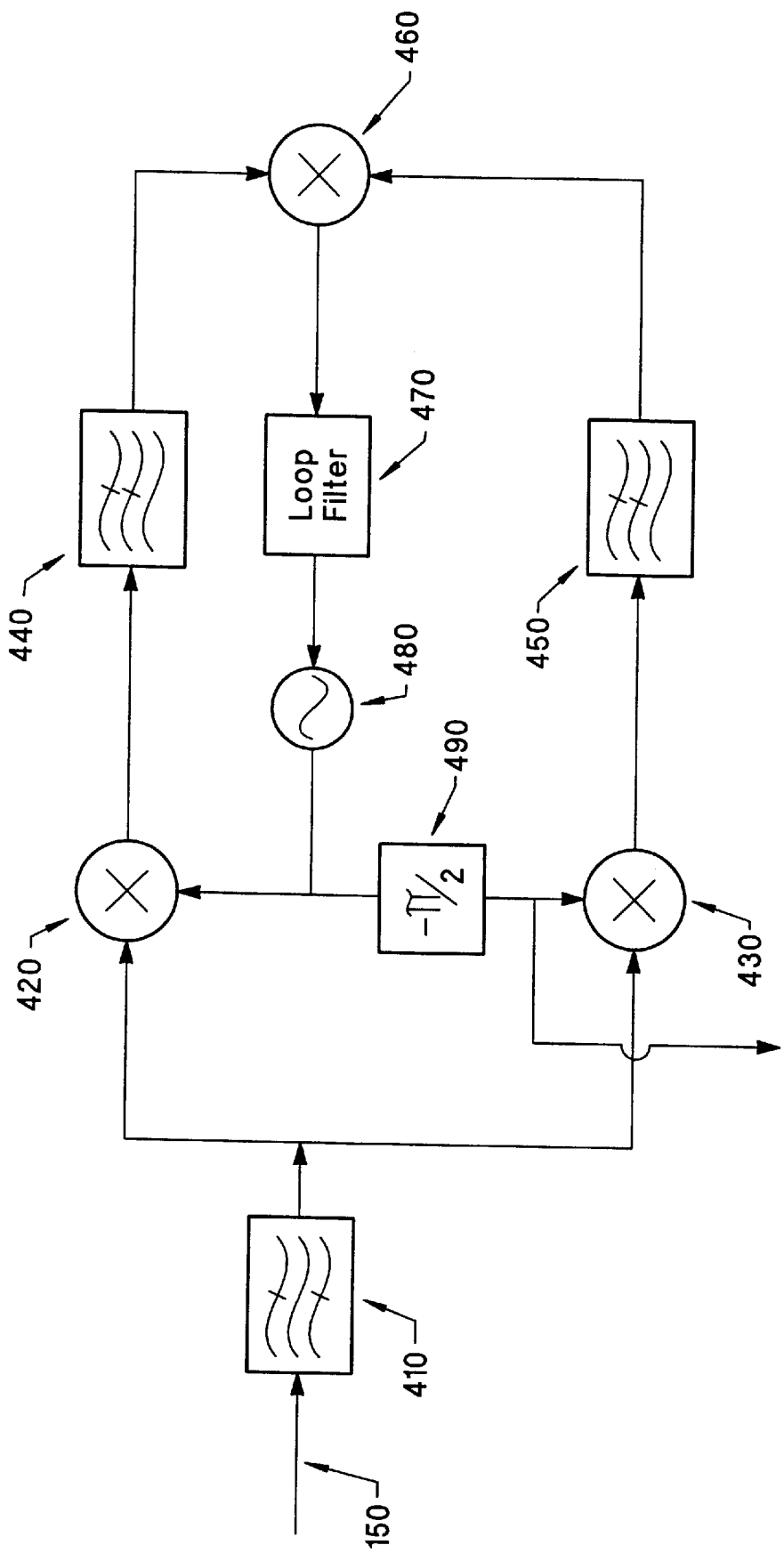
FIG. 4 shows a mixing Costas loop.

FIG. 4 shows a mixing Costas loop. As before, signal 150 goes through bandpass filter 410. In the Costas loop, the output of bandpass filter 410 drives quadrature mixer 420 and in-phase mixer 430. The output of mixer 420 is low pass filtered 440 and fed to mixer 460, and the output of mixer 430 is low pass filtered 450 and fed to mixer 460. The output of mixer 460 feeds loop filter 470, which controls voltage controlled oscillator 480. The output of VCO 480 fed to quadrature mixer 420, and delayed 490 one quarter cycle ($-\pi/2$), to feed in phase mixer 430. Delayed signal 500 is the phase-locked reference signal. In this topology, a VCO having quadrature outputs may also be used, and phase detectors may be substituted for mixers.

Regardless of the PLL topology used, whether they use mixers or phase detectors, whether they are digital or analog, or whether they are conventional PLLs, harmonic locking, or Costas loops, analog or digital, the goal is to reduce the effects of the eccentricity introduced by disk misalignment. This disk misalignment produces harmonic errors in the input signal, which in turn produces phase errors in the reference signal output by the PLL, even when the loop is locked. Because the phase-locked loop is a nonlinear device which behaves linearly only near lock, harmonic correction as taught by the present invention is distinct from known loop filters. The application of harmonic correction to timing applications, such as phase locked loops, is new.

Harmonic correction solutions take the form of filtering solutions, where the harmonic is filtered out, or cancellation and feedforward solutions. In all embodiments, harmonic correction may be applied to the loop at all times, or it may be switched in once the desired degree of loop lock has been obtained. Such a switching strategy can provide for aggressive locking performance of the loop, followed by the reduced phase jitter achieved when harmonic correction is enabled.

In dealing with a harmonic disturbance, the disturbance can be removed from the input signal, and not passed to the PLL. This is a form of external harmonic correction, since the harmonic disturbance never gets into the loop. External filtering is applied by placing a notch filter for each desired harmonic component ahead of the PLL input bandpass filter, or as part of the PLL input bandpass filter.

Alternatively, the PLL VCO can track the disturbance. This is a form of internal harmonic correction. In the case of disk drives, the harmonic disturbance represents a legitimate change in the reference signal on the disk itself as the media passes under the read head. Thus it may be advantageous to follow this harmonic signal, so that the VCO output tracks the harmonic disturbance. This results in a better synchronization between the recovered signal from the media, and the reference generated by the PLL.

Figure 5:
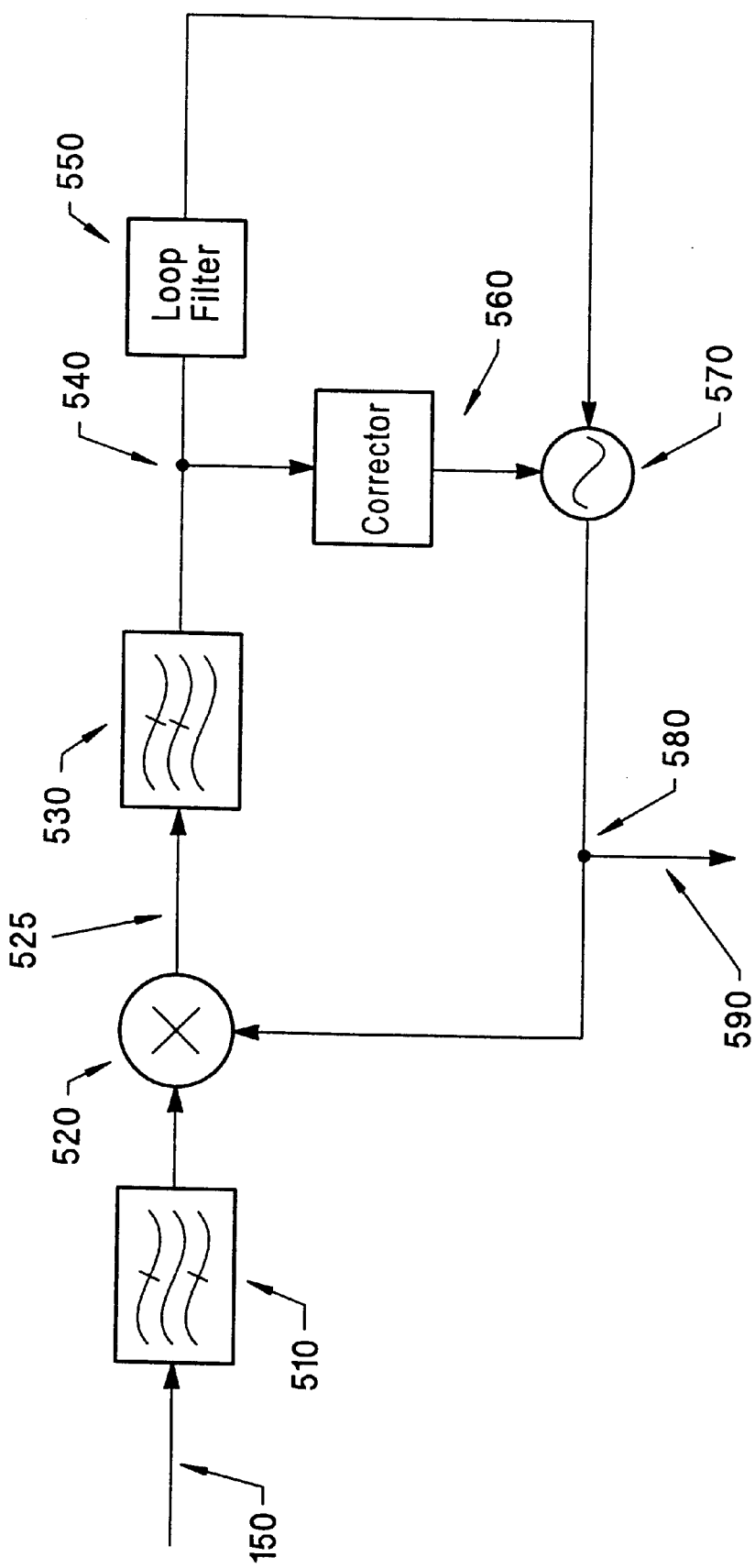
FIG. 5 shows a mixing loop with harmonic correction.

In a first embodiment of the invention, where the harmonic disturbance is well within the PLL bandwidth, an additional integrating pole or a bump (or resonant) filter is added to the loop. Assume the frequency of the harmonic disturbance to be at frequency $w_0$. The goal then is minimize this error signal within the loop, given the usual constraints including loop stability. This is done by maximizing the gain of the loop at frequency $w_0$, without destabilizing the loop, so that the loop follows that harmonic and minimizes the error. This is shown in FIG. 5, applied to a mixing loop.

Input signal 150 passes through bandpass filter 510. The harmonic disturbance of interest is within the passband of bandpass filter 510. The output of bandpass filter 510 goes to mixer 520, which mixes the signal with VCO output 570 to generate signal 525 which contains high frequency components and baseband components (which include the phase error between the reference clock and the generated clock). Low pass filter 530 attenuates the high frequency components, leaving mostly the signal with phase error 540. This signal 540 is passed to loop filter 550 which provides stability of the PLL, and to harmonic corrector 560. While loop filter 550 functions as is known in the art, harmonic corrector 560 in this embodiment passes the mixing product caused by the harmonic disturbance at $w_0$. The outputs of loop filter 550 and harmonic corrector 560 control VCO 570. The output 580 of VCO 570 drive mixer 520, and provide reference output 590. Harmonic corrector 560 may be switched in and out of the loop by switching its input, output, or both. This form of harmonic correction may also be applied to harmonic locking loops and Costas loops, mixing or phase detector loops, analog or digital (single rate or multi rate).

Figure 6:
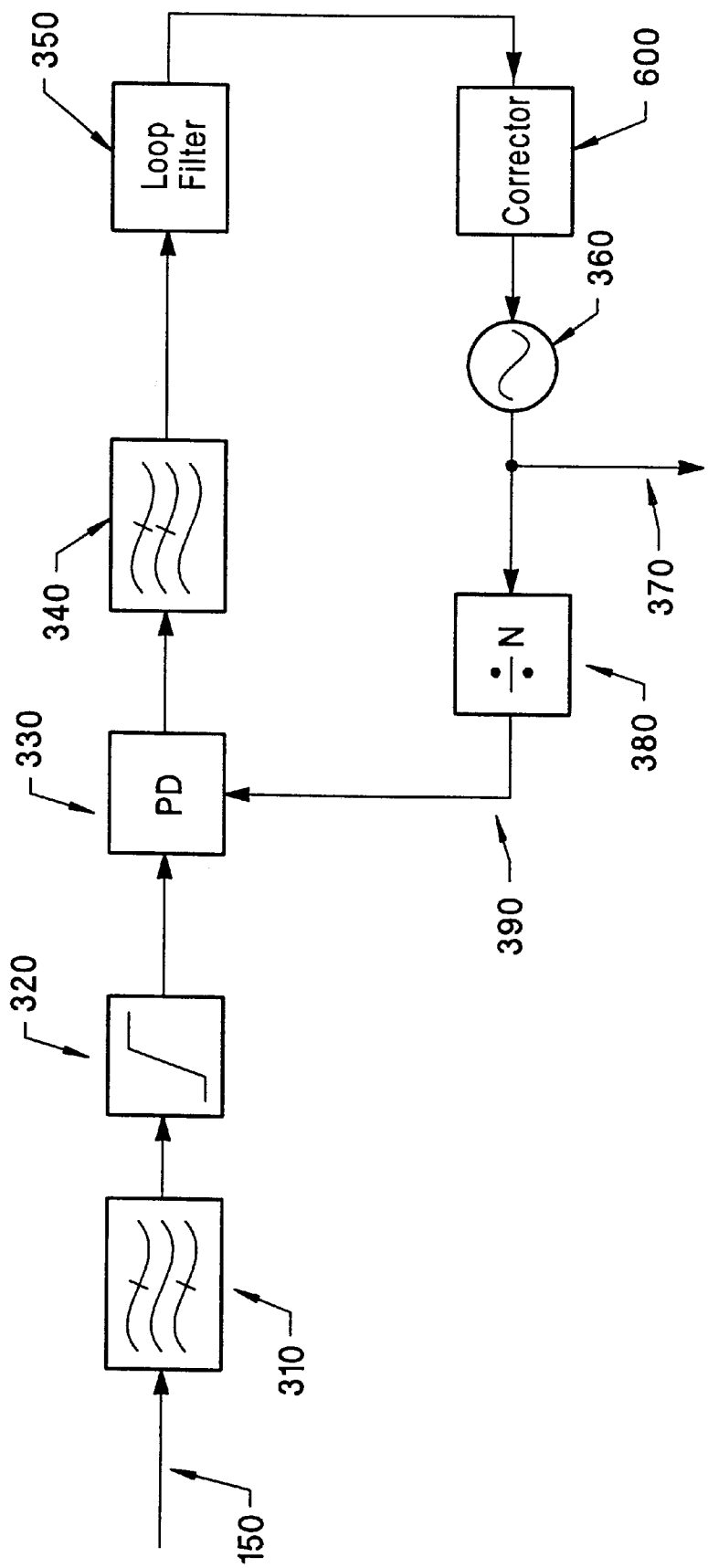
FIG. 6 shows a harmonic locking phase-locked loop with harmonic correction.

In this embodiment, as in others, a multiplicity of filters is present. In FIG. 5 for example, low pass filter 530 is followed by loop filter 550 and harmonic corrector 560. While FIG. 5 shows these three elements separately, other topologies are possible. Rather than implementing these in parallel with their outputs summed as shown, it may be advantageous to place them in series. This is shown in FIG. 6, showing a harmonic locking phase-locked loop with harmonic correction. This implementation shows harmonic corrector 600 placed in series with loop filter 350, and feeding VCO 360.

Figure 7:
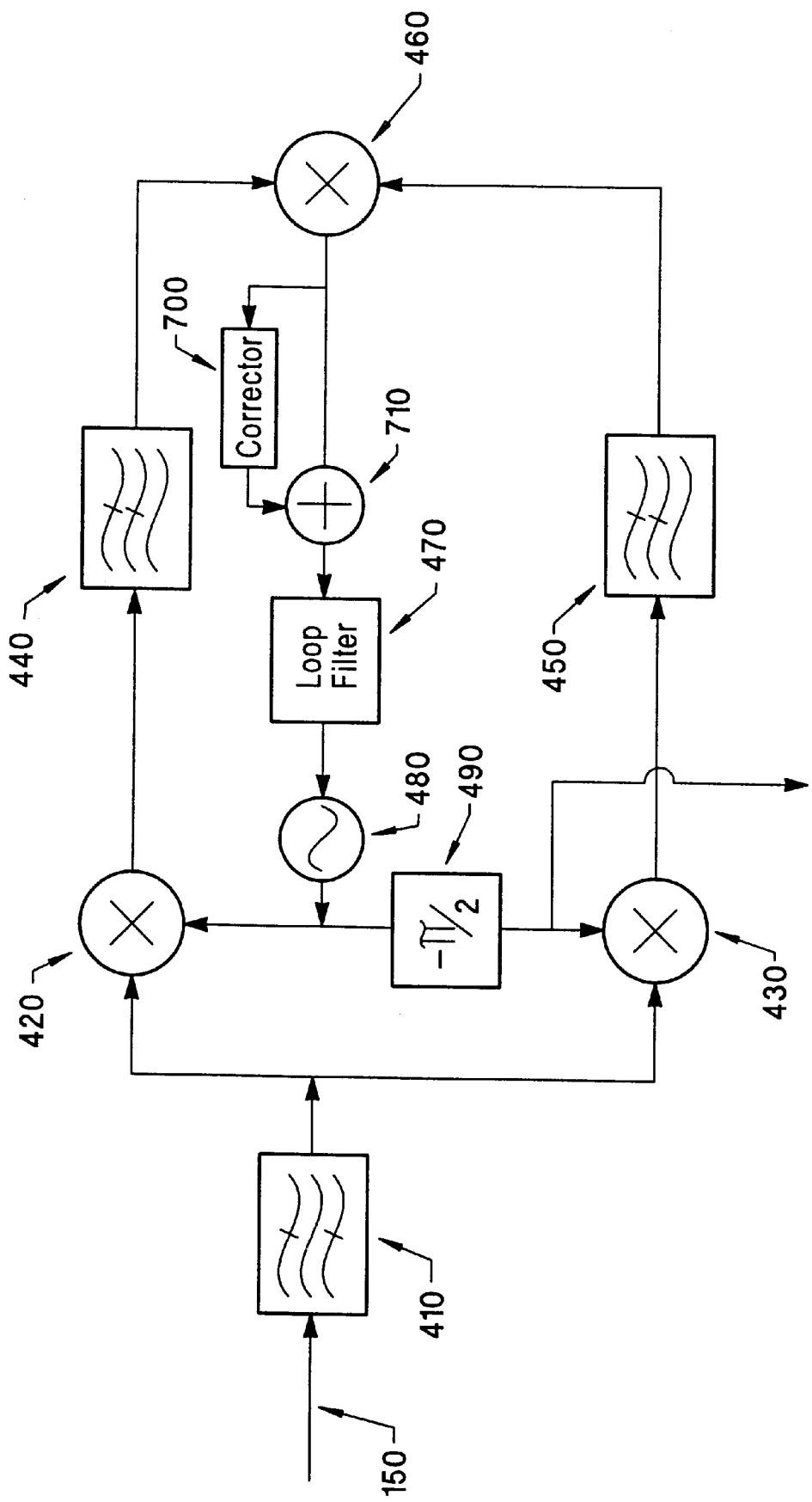
FIG. 7 shows a mixing Costas loop with harmonic correction.

FIG. 7. Shows a mixing Costas loop with harmonic correction. Harmonic corrector 700 feeds summer 700, which combines with the output of mixer 460 to drive loop filter 470 and VCO 480. In some implementations, it may be desirable to combine these separate filters. This is especially true for digital signal processor (DSP) implementations, where it is common to convolve the separate filters into one equivalent filter section, as is known to the art.

In a second embodiment of the invention, where the harmonic disturbance is well outside the PLL bandwidth, an additional low pass or notch (anti-resonant) filter is added either to the inside of the loop or the outside of the loop. The former is a form of internal correction, and the later is a form of external correction.

In a third embodiment, feedforward cancellation is performed by generating a sinusoid at a phase and frequency so as to cancel out the harmonic disturbance. In this digital approach, an adaptive feedforward canceler, a matching signal is generated, and then used to cancel the residual harmonic error. The matching signal is generated by modeling the residual harmonic disturbance as a Fourier series, and identifying the relevant Fourier coefficients. Cancellation takes these:coefficients and injects the matching signal into the loop at an appropriate point to either cancel the signal (external correction), or follow the signal (internal correction). This approach applies to any linear combination of harmonics deemed important. *Feedforward cancellation is taught in Harmonic Generation in Adaptive Feedforward Cancellation Schemes, IEEE Transactions on Automatic Control*, 39(9) pp 1939–1944 by Bodson et al., 1994.

In a fourth embodiment, harmonic cancellation is performed using a repetitive control scheme by using a filtered version of the residual errors on previous rotations of the media. Repetitive control schemes are taught by Tomizuka et al., *Discrete-time domain analysis and synthesis of repetitive controllers, Proceedings of the* 1988 *American Control Conference*, pp 860–866. In this digital approach, N samples of the disturbance are calculated during the rotation of the media. The harmonic portion of the disturbance it repeats with each revolution, and therefore, with each additional N samples. Thus, by calculating and storing N (or a filtered multiple of N) samples of the residual errors, and filtering these samples so as to maintain loop stability, the harmonic disturbance can once again either be canceled or followed by the PLL. This structure provides a periodic integrator with period N. The periodic integrator when coupled into the feedback loop drives out all disturbances of period N.

The foregoing detailed description of the present invention is provided for the purpose of illustration and is not intended to be exhaustive or to limit the invention to the precise embodiments disclosed. Accordingly the scope of the present invention is defined by the appended claims.

What is claimed is:

1. A removable media disk drive comprising:

reading means for reading a signal from the media, a phase-locked loop connected to the means for reading, the phase locked-loop recovering a reference signal from the signal on the media, and a harmonic corrector for reducing the effects of harmonic disturbance on the phase-locked loop, wherein the harmonic corrector comprises a notch filter connected between the reading means and the phase-locked loop, the notch filter filtering desired harmonic content.

2. A removable media disk drive comprising:

reading means for reading a signal from the media, a phase-locked loop connected to the means for reading, the phase locked-loop recovering a reference signal from the signal on the media, and a harmonic corrector for reducing the effects of harmonic disturbance on the phase-locked loop, wherein the harmonic corrector is a resonant filter increasing the loop gain of the phase-locked loop at the harmonic disturbance.

3. A removable media disk drive comprising:

reading means for reading a signal from the media, a phase-locked loop connected to the means for reading, the phase locked-loop recovering a reference signal from the signal on the media, and a harmonic corrector comprising a feedforward corrector, wherein the feedforward corrector comprises means for generating a sinusoid at a phase and frequency so as to cancel the harmonic disturbance.

4. A removable media disk drive comprising:

reading means for reading a signal from the media, a phase-locked loop connected to the means for reading, the phase locked-loop recovering a reference signal from the signal on the media, and a harmonic corrector comprising a feedforward corrector, wherein the feedforward corrector comprises:

means for collecting residual errors from the harmonic disturbance
on one or more rotations of the media;
means for filtering the residual errors, and
means for feeding forward the filtered residual errors.

* * * * *